US00RE37912E

(19) United States
(12) Reissued Patent
Park et al.

(10) Patent Number: US RE37,912 E
(45) Date of Reissued Patent: Nov. 26, 2002

(54) VARIABLE-LENGTH ENCODER AND DECODER USING SYMBOL/CODE-WORD RE-ASSOCIATION OF A CODING TABLE

(75) Inventors: Ju-ha Park, Suwon (KR); Byeung-woo Jeon, Sungnam (KR); Jechang Jeong, Seocho-gu (KR)

(73) Assignee: Samsung Electronics Co., Ltd., Kyungki-Do (KR)

(21) Appl. No.: 09/629,108

(22) Filed: Jul. 28, 2000

Related U.S. Patent Documents

Reissue of:
(64) Patent No.: 5,786,780
Issued: Jul. 28, 1998
Appl. No.: 08/863,952
Filed: May 27, 1997

U.S. Applications:
(63) Continuation of application No. 08/381,649, filed on Jan. 31, 1995, now abandoned.

(30) Foreign Application Priority Data

Nov. 30, 1994 (KR) ..... 94-32215

(51) Int. Cl.[7] ..... H03M 7/40
(52) U.S. Cl. ..... 341/67; 341/65
(58) Field of Search ..... 341/65, 67

(56) References Cited

U.S. PATENT DOCUMENTS 4,839,724 A * 6/1989 Keesen et al. ..... 358/138
4,957,724 A * 9/1990 DeWith ..... 358/133
5,253,053 A * 10/1993 Chu et al. ..... 358/133

FOREIGN PATENT DOCUMENTS

EP 0613303 * 8/1994
EP 0273130 * 7/1998
JP 2-124644 * 5/1990
JP 2-302127 * 12/1990
JP 3-14366 * 1/1991
JP 4-239225 * 8/1992
JP 6-61869 * 3/1994
JP 6-225286 * 8/1994

* cited by examiner

*Primary Examiner*—Howard L. Williams
(74) *Attorney, Agent, or Firm*—Sughrue Mion, PLLC

(57) ABSTRACT

A variable-length encoder using a code table having a symbol/code-word re-association feature, which includes a first storing portion for storing previously generated code table information, a first re-associating portion for generating re-associated code table information and re-association information indicative of the relation between a symbol and a corresponding code word from a previously generated code table information stored in the first storing portion, based on the frequency of occurrence of externally applied symbols during a predetermined time period, a delay for delaying and outputting the same symbols as those input to the first re-associating portion during the predetermined time period, a re-association information storing portion for storing the re-associated code table information and re-association information and sequentially outputting the re-association information, a variable-length encoder for receiving the symbols stored in the delay and generating and sequentially outputting code words according to the re-associated code table information stored in the re-association information storing portion, and a multiplexer which outputs the re-association information from the re-association information storing portion and the code words output from the variable-length encoder, to thereby reduce the code length of code words generated by variable-length encoding even when the frequency of occurrence of symbols used in forming a previously generated code table is different from that of the symbols applied during the predetermined time period.

66 Claims, 3 Drawing Sheets

FIG. 1

| VARIABLE-LENGTH CODE WORD | RUN | LEVEL |
|---|---|---|
| 1S | 0 | 1 |
| 11S | 0 | 1 |
| 011S | 1 | 1 |
| 0100S | 0 | 2 |
| 0101S | 2 | 1 |
| 0011 1S | 3 | 1 |
| 0011 0S | 4 | 1 |
| 0001 10S | 1 | 2 |
| 0001 11S | 5 | 1 |
| 0001 01S | 6 | 1 |
| 0001 00S | 7 | 1 |
| 0000 110S | 0 | 4 |
| 0000 100S | 2 | 2 |
| 0000 111S | 8 | 1 |
| 0000 101S | 9 | 1 |
| 0010 1S | 0 | 3 |
| 0010 0110S | 0 | 5 |
| 0010 0001S | 0 | 6 |
| 0010 0101S | 1 | 3 |
| 0010 0100S | 3 | 2 |
| 0010 0111S | 10 | 1 |
| 0010 0011S | 11 | 1 |
| 0010 0010S | 12 | 1 |
| 0010 0000S | 0 | 7 |
| 0000 0010 10S | 0 | 7 |
| 0000 0011 00S | 1 | 4 |
| 0000 0010 11S | 2 | 3 |
| 0000 0011 11S | 4 | 2 |
| 0000 0010 01S | 5 | 2 |
| 0000 0011 10S | 14 | 1 |
| 0000 0011 01S | 15 | 1 |
| 0000 0010 00S | 16 | 1 |
| 0000 0001 1101S | 0 | 8 |
| 0000 0001 1000S | 0 | 9 |
| 0000 0001 0011S | 0 | 10 |
| 0000 0001 0000S | 0 | 11 |
| 0000 0001 1011S | 1 | 5 |
| 0000 0001 0100S | 2 | 4 |
| 0000 0001 1100S | 3 | 3 |

VARIABLE-LENGTH ENCODER AND DECODER USING SYMBOL/CODE-WORD RE-ASSOCIATION OF A CODING TABLE

Matter enclosed in heavy brackets [ ] appears in the original patent but forms no part of this reissue specification; matter printed in italics indicates the additions made by reissue.

This is a continuation of application Ser. No. 08/381,649 filed Jan. 31, 1995 now abandoned.

BACKGROUND OF THE INVENTION

1. Field of the Invention

The present invention relates to a variable-length encoding/decoding system for video data. More particularly, it relates to a variable-length encoding/decoding system which re-associates a predetermined relation between a symbol and a code-word based on the frequency of occurrence of symbols to be variable-length coded (VLC), to thereby increase encoding efficiency.

2. Description of the Prior Art Recently, video and audio equipment employing digital signal processing methods have increased, and have been briskly developed. Therefore, many studies have been initiated relating to encoding a video and audio signal into a digital signal. Since an encoded video signal requires a large amount of digital data, various methods have been suggested to compress the encoded digital data prior to storing it on a recording medium. Among the various compression methods are a transform coding method, vector-quantization method, differential pulse coded modulation (DPCM), and variable-length coding method. Such coding methods are used to remove redundant data contained in a digital signal and, thus, reduce the total amount of transmitted or recorded data.

The VLC method is a technique to convert symbols in the form of [run,level], obtained through discrete cosine transform (DCT), quantization and zigzag scan operations, into corresponding code words by using a VLC table.

FIG. 1 shows one example of a VLC table. According to the [run,level] data of the symbols shown in FIG. 1 at the right-hand side of the table, code words having different lengths are associated with the respective symbols. Huffman coding is a method of associating symbols and code words based on the frequency of occurrence of the symbols. That is, Huffman coding is a data compression method in which, considering the frequency of occurrence of a symbol, a code word having a short length is associated with a symbol having a high frequency of occurrence, while a code word having a longer length is associated with a symbol having a lower frequency of occurrence. A typical example of an apparatus implementing the above method is illustrated in FIG. 2.

FIG. 2 shows a conventional variable-length encoder, and FIG. 3 depicting a conventional variable-length decoder. The variable-length encoder of FIG. 2 comprises an encoder 1 and VLC table 2. The variable-length decoder of FIG. 3 comprises a decoder 3 and variable length decode (VLD) table 4 which is the same as to VLC table 2. When a symbol is input, encoder 1 locates a code word corresponding to the input symbol among the code words input from VLC table 2, and outputs the corresponding code word. Decoder 3 locates a symbol corresponding to the input code word from VLD table 4, and outputs the corresponding symbol, to thereby restore the original symbol input to the variable-length encoder.

However, if there is difference between the frequency of occurrence of symbols used in constructing VLC table 2 and the corresponding VLD table 4, and that of symbols currently used in VLC coding, optimum variable-length coding can not be achieved. In other words, if the characteristics of an image to be currently variable-length coded are different from those of an image used when a code table is designed, a previously generated VLC table 2 and VLD table 4 cannot be changed to accommodate the differing characteristics. Thus, such an encoder/decoder and method do not fully accomplish the object of compressing the entire amount of data to be stored or transmitted.

SUMMARY OF THE INVENTION

Therefore, it is an object of the present invention to provide a variable-length encoder in which, even though the symbol/code-word association of a previously generated code table is used, the frequency of occurrence of the currently input symbols is measured in order to re-associate the symbols to the appropriate code words. Such a re-association provides that the amount of data to be consumed is minimized even when symbols are input that have a different frequency of occurrence from that of symbols considered when the code table is generated.

Another object of the present invention is to provide a variable-length decoder for restoring the original symbols represented by the code words obtained by variable-length coding, in which a symbol corresponding to an input code word is searched for in a previously generated decode table according to symbol/code-word re-association control information, to thereby decode the corresponding symbol.

To accomplish the first object of the present invention, there is provided a variable-length encoder using symbol/code-word re-association of a code table comprising a first storing means for storing previously generated code table, a first re-associating means for generating re-associated code table and re-association information indicative of the relation between a symbol and a corresponding code word from the previously generated code table stored in the first storing means, based on the frequency of occurrence of externally applied symbols during a predetermined time period, a delay for delaying and outputting the same symbols as those input to the first re-associating means during the predetermined time period, a re-association information storing means for storing the re-associated code table and re-association information and sequentially outputting the re-association information, variable-length coding means for receiving the delayed symbols and generating the sequentially outputting code words according to the re-associated code table stored in the re-association information storing means, and means for multiplexing and outputting the re-association information from the re-association information storing means and outputting the code words output from the variable-length coding means.

To accomplish the second object of the present invention, there is provided a variable length decoder using symbol/code-word re-association of a code table comprising a second storing means for storing the same code table as that previously generated and stored in the first storing means, demultiplexing means for receiving data output from the means for multiplexing, dividing and outputting re-association information and code words, a second re-association means for receiving the re-association information from the demultiplexing means, re-associating a corresponding symbol/code-word relation, and storing re-associated code table, and variable-length decoding means for decoding an input code word based on the code table information stored in the second re-associating means to thereby generate a symbol.

BRIEF DESCRIPTION OF THE DRAWINGS

The above objects and advantages of the present invention will become more apparent by describing in detail a preferred embodiment thereof with reference to the attached drawings in which:

FIG. 1 illustrates one example of a VLC table;

DETAILED DESCRIPTION OF THE INVENTION

Figure 2:
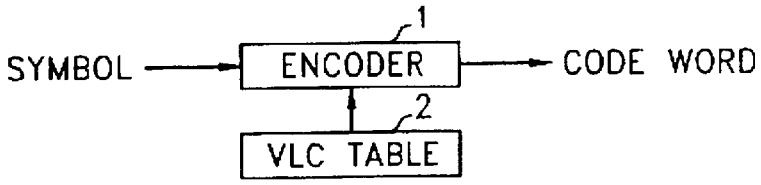
FIG. 2 (PRIOR ART)
FIG. 2 is a block diagram of a conventional variable-length encoder.
Figure 3:
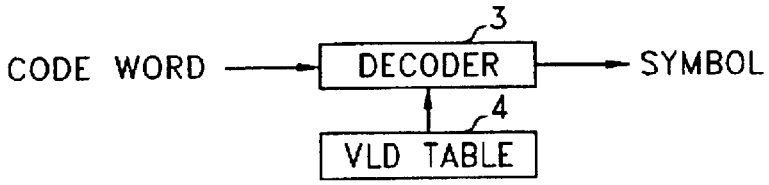
FIG. 3 (PRIOR ART)
FIG. 3 is a block diagram of a conventional variable-length decoder.
Figure 4:
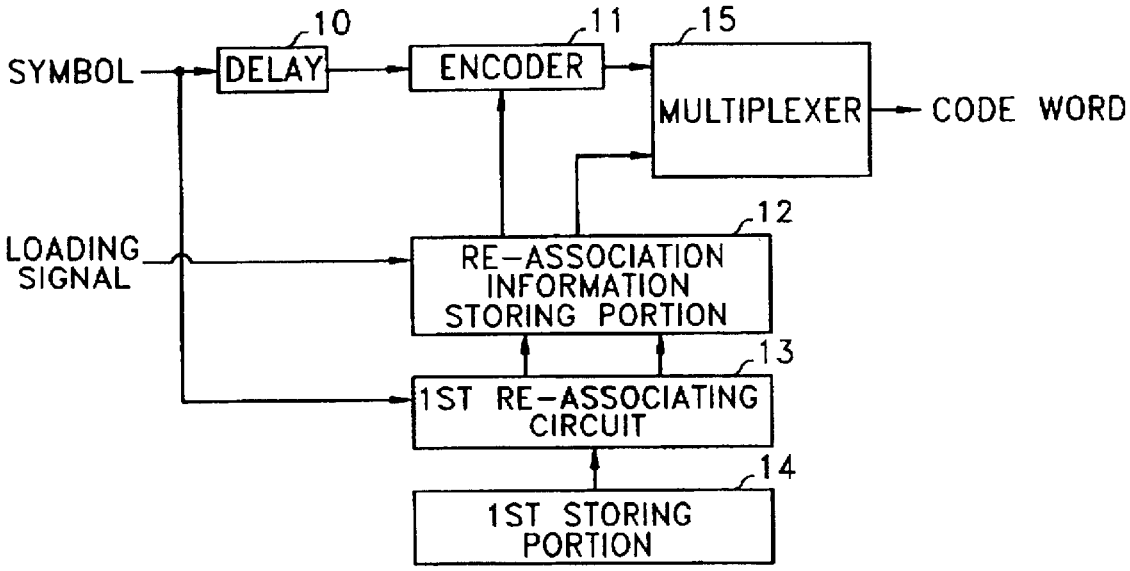
FIG. 4 is a block diagram of one embodiment of a variable-length encoder according to the present invention.

Referring to FIG. 4 data to be variable-length encoded, that is, a symbol, is applied to a delay circuit 10 and a first re-associating circuit 13. The symbol input to the circuit shown in FIG. 4 is typically composed of run and level [run, level] data produced by run-length encoding. Delay circuit 10 delays the input symbol for a predetermined time period and outputs the delayed symbol to encoder 11.

First re-associating circuit 13 receives the same symbol as that input to delay circuit 10, in order to re-associate the relation of symbol/code-word in a code table. In particular, first re-associating circuit 13 performs a code table re-association operation by using the symbols which are input during the predetermined time period. The predetermined time period is that time period required to gather an appropriate number of symbols for re-associating the symbols and code words in the code table. In typical applications the predetermined time period is set to correspond to one video frame or one slice. First re-associating circuit 13 reads out a code table from a first storing portion 14 and stores the read-out information in a built-in memory (not shown). First re-associating circuit 13 performs the code table re-association operation by using the code table stored in the memory and the symbols input during the predetermined time period. The code table re-association operation is explained in detail below with reference to FIG. 5.

Figure 5:
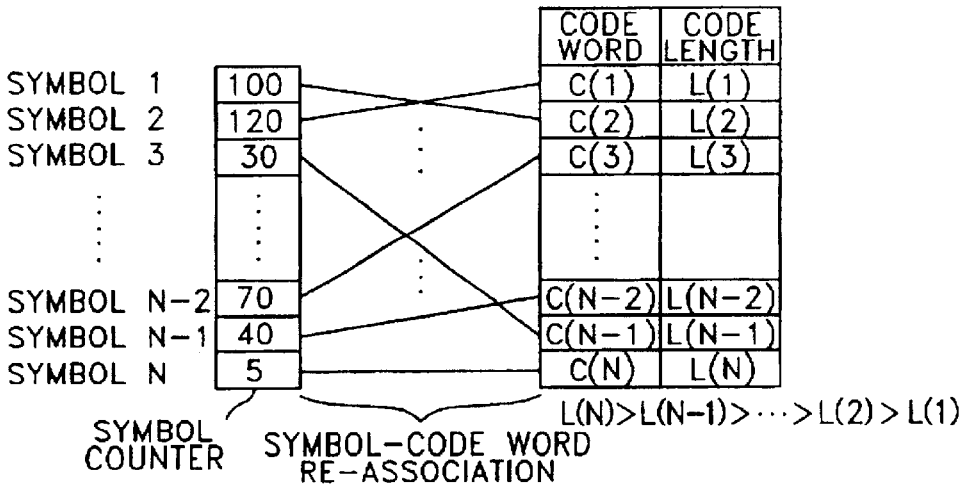
FIG. 5 is a diagram for explaining the re-association of a code table by a first associating circuit.

The left-hand column shown in FIG. 5 represents a plurality of symbol counters. Each symbol counter corresponding to one of the respective symbols. The two columns shown at the right-hand side of FIG. 5 indicate, in one column, code words where each code word corresponds to one of the respective symbols, and, in the other column, the length of the respective code words, that is, the code length. The code length satisfies the relation L(N)>L(N-1)> . . . >L(2)>L(1). In other words, code word C(1) has the shortest code length, and C(N) has the longest code length.

Prior to re-association of a code table, the symbol counters of FIG. 5 are all reset to "zero" as the initial value. First re-associating circuit 13 recognizes the respective symbols input during the predetermined time period. The respective symbol counter corresponding to an input symbol, counts the corresponding input symbol and stores the counted value. When counting of the input symbols during the predetermined time period is finished, first re-associating circuit 13 performs a symbol/code-word re-association operation by re-associating the relationship between symbols and code words in the code table, as shown in FIG. 5. For instance, in FIG. 5 "symbol 2" has a count value of 120 which is the largest among the symbols. Accordingly, "code word C(1)", which has the shortest length, is associated with symbol 2. When the re-association of symbols and code words with respect to all of the symbols input during the predetermined time period is finished, first re-associating circuit 13 outputs a re-associated code table and symbol/code-word re-association information I(n)'s to a re-association information storing portion 12. Here, I(n) refers to an index of a symbol corresponding to code word C(n). For example, in FIG. 5. I(1)=2 since code word C(1) is now associated with symbol 2. When the re-associated code table and symbol/code-word re-association I(n) is finished being stored in the re-association information storing portion 12, re-association information storing portion 12 outputs to multiplexer 15 the symbol/code-word re-association information I(n)'s in relation with a symbol to be variable-length encoded, according to a loading signal applied by a controller (not shown). An encoder 11 converts the respective symbols applied from delay circuit 10 into corresponding code words by using the re-associated code table stored in re-association information storing portion 12. In the case in which encoding is finished, code words and corresponding symbol/code-word re-association information I(n)'s are applied to multiplexer 15, and the first re-associating circuit is initialized with the previously generated code table stored in the first storing portion. That is, the symbol counters are all reset to zero and the re-association is reset back to that of the previously generated code table. This refreshing prevents propagation of errors which may happen during transmission.

Figure 6:
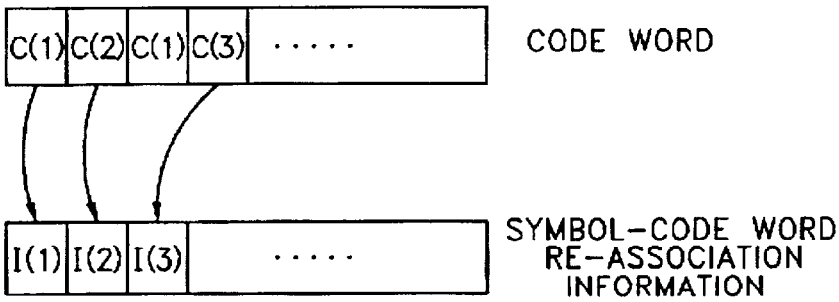
FIG. 6 is a diagram for explaining the actually transmitted re-association information.

FIG. 6 shows the relation between the code words C(n) output from encoder 11 and the symbol/code-word re-association information I(n) output from re-association information storing portion 12. When "code word C(1)" is generated with respect to the first symbol, encoder 11 outputs "code word C(1)," and the symbol/code-word re-association information I(1) corresponding to code word C(1), provided by the reassociation information storing portion 12, is output, which is needed by the decoder. When "code word C(2)" is generated with respect to the second symbol, encoder 11 outputs "code word C(2)", and in the same manner storing portion 12 provides symbol/code-word re-association information I(2) corresponding to code word C(2) which is needed by the decoder. When "code word C(1)" is generated with respect to the third symbol, encoder 11 outputs "code word C(1)," and the symbol/code-word re-association information I(1) corresponding to code word C(1) need not be transmitted, since it has already been transmitted and, hence, is already specified to the decoder. In this manner, all of the symbols used in producing the re-associated code table are encoded. In another embodiment of the invention, the re-association information is transmitted prior to a symbol only when the symbol is transmitted for the first time. That is, symbol/code-word re-association information is output only for code words first encountered. As a result, even when a symbol is counted several times informing a re-associated code table, multiplexer 15 outputs only one set of symbol/code-word re-association information with respect to that symbol. Symbol/code-word re-association information with respect to those symbols that are not used in producing the re-associated code table information, is not transmitted. The symbol/code-word re-association information indicative of the symbol code-word relation used in encoding, and the corresponding code words generated by the encoder are output to multiplexer 15. Multiplexer 15 multiplexes and outputs code words C(n)'s corresponding to the input symbols and symbol/code-word re-association information I(n)'s in such a manner that the symbol/code-word re-association information is output first and then all of the code words generated are output.

The present invention can be modified in the following manner, which, however, is not applied to the embodiment described above, rather than transmitting only one symbol/code-word re-association information I(n) with respect to multiple instances of a same symbol previously generated, corresponding symbol/code-word re-association information is multiplexed and transmitted whenever a code word corresponding to a symbol that is the same as a previously generated symbol is transmitted.

Figure 7:
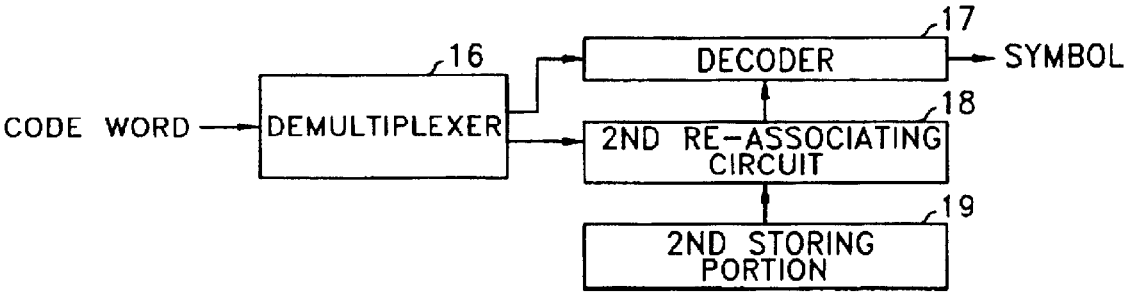
FIG. 7 is a block diagram of a variable-length decoder according to the present invention.

Referring to FIG. 7, which shows a variable-length decoder, a second re-associating circuit 18 reads a previously pre-defined generated code table from a second storing portion 19, and stores the in a memory (not shown). When the code table is stored in the memory of second re-associating circuit 18, a demultiplexer 16 receives data output from multiplexer 15 shown in FIG. 4, and demultiplexes and outputs the data. More specifically, demultiplexer 16 divides received data into symbol/code word re-association information and code words. Demultiplexer 16 outputs the symbol/code-word re-association information to second re-associating circuit 18, and outputs the code words to recorder 17. Second re-associating circuit 18 re-associates the relationship between the symbols and the code words of the code table previously established according to the symbol/code-word re-association information output from demultiplexer 16. The re-associated table is stored in a built-in memory (not sown). In the data output from demultiplexer 16, the symbol/code-word re-association information is output first and the corresponding code word is output later. Decoder 17 outputs a symbol corresponding to the code word.

Accordingly, in the present invention, even when the frequency of occurrence of symbols during a predetermined time period is different from that of symbols earlier used in constructing a code tale, the code length of the code words generated by variable-length coding can be reduced. This decreases the amount of data transmitted or stored over that stored or transmitted when the previously generated predefined code table is used. Further, the present invention can efficiently transmit information for symbol/code-word re-association to a decoder, thus, increasing the compression efficiency of data transmitted to decoders.

While the present invention has been shown and described with reference to particular embodiments thereof, it will be understood by those skilled in the art that various changes in form and details may be effected therein without departing from the spirit and scope of the invention as defined by the following claims.

What is claimed is:

1. A variable-length code word transmission system, comprising:

encoder means for receiving and encoding input symbols into variable-length code words based on a frequency of occurrence of said symbols, said encoder means including means for re-associating a relationship between code words and each distinct received symbol and generating re-association information for each distinct received symbol; and means for transmitting said re-association information generated by said means for re-associating and said variable-length code words in an alternating manner; and decoder means for decoding the transmitted variable-length code words based on said transmitted re-association information.

2. The variable-length code word transmission system claimed in claim 1, wherein said encoder means further comprises:

fast storing means for storing a previously generated code table;

first re-associating means for receiving externally applied symbols during a predetermined time period, generating a re-associated code table and re-association information indicative of a relation between a symbol and a corresponding code word from said previously generated code table stored in said first storing means, based on the frequency of occurrence of the externally applied symbols during a predetermined time period;

delay means for delaying and outputting the same symbols as those input to said first re-associating means during the predetermined time period;

re-association information storing means for storing said re-associated code table and re-association information for each distinct received symbol and sequentially outputting said re-association information;

variable-length coding means for receiving said symbols output from said delay means and generating and sequentially outputting code words according to said re-associated code table stored in said re-association information storing means; and means for multiplexing and outputting said re-association information from said re-association information storing means and said code words output from said variable-length coding means.

3. The variable-length code word transmission system claimed in claim 1, wherein said decoder means comprises:

storing means for storing the same code table as that previously generated and stored in the encoder means;

demultiplexing means for receiving data output from the encoder means, and dividing and outputting symbol/code-word re-association information and code words from the received data;

re-associating means for receiving said re-association information from said demultiplexing means, re-associating a code-word and a corresponding symbol, and storing said re-associated code table; and variable-length decoding means for decoding said code words based on said code table stored in said re-associating means to thereby generate a symbol.

4. The variable-length code word transmission system as claimed in claim 1, wherein said encoder means is a Huffman variable-length encoder.

5. The variable-length code word transmission system as claimed in claim 1, wherein said decoder means is a Huffman variable-length decoder.

6. The variable-length code word transmission system claimed in claim 1, wherein said means for transmitting transmits said re-association information whenever a corresponding variable-length code word is transmitted.

7. A variable-length encoder using symbol/code-word re-association of a code table comprising:

delay means for delaying externally applied symbols;

first storing means for storing a previously generated code table;

first re-associating means for generating a re-associated code table and re-association information indicative of the relation between one of said symbols and a corresponding code word from said previously generated code table stored in said first storing means, based on a frequency of occurrence of the externally applied symbols during a predetermined time period, wherein said first re-associating means generates re-association information for each different one of the externally applied symbols;

re-association information storing means for storing said re-associated code table and said re-association information, and sequentially outputting said re-association information;

variable-length encoding means for receiving the delayed symbols and generating and sequentially outputting code words according to said re-associated code table stored in said re-association information storing means; and means for multiplexing and outputting said re-association information output from said re-association information storing means, and said code words output from said variable-length encoding means in an alternating manner.

8. The variable-length encoder using a symbol/code-word re-association of a code table as claimed in claim 7, wherein said first re-associating means re-associates said symbols to said code words of said previously generated code word table stored in said first storing means so that, for symbols used in re-association of the code table, a symbol having a higher frequency of occurrence is associated with a code word having a shorter length.

9. The variable-length encoder using symbol/code-word re-association of a code table as claimed in claim 7, wherein said first re-associating means comprises:

a plurality of symbol counters for counting the number of each symbol applied during the predetermined time period and storing the counted values for each of the respective symbols, said first re-associating means generating the re-associated code table and re-association information from a previously generated code table, based on the counted values.

10. The variable-length encoder using symbol/code-word re-association of a code table as claimed in claim 7, wherein said predetermined time period is a time period required to re-associate symbols to code words of a code table by using symbols obtained from one slice of video data.

11. The variable-length encoder using symbol/code-word re-association of a code table as claimed in claim 7, wherein said predetermined time period is a time period required to re-associate symbols to code words of a code table by using symbols obtained from one frame of video data.

12. The variable-length encoder using symbol/code-word re-association of a code table as claimed in claim 7, wherein said re-association information storing means outputs corresponding re-association information to said multiplexing means whenever during the predetermined interval a code word is first output from said variable-length coding means.

13. The variable-length encoder using symbol/code-word re-association of a code table as claimed in claim 7, wherein said re-association information storing means outputs only one set of re-association information to said means for multiplexing with respect to a plurality of the same code words.

14. The variable-length encoder using symbol/code-word re-association of a code table as claimed in claim 7, wherein said means for multiplexing outputs the re-association information corresponding to a code word prior to outputting the corresponding code word.

15. The variable-length encoder using symbol/code-word re-association of a code table as claimed in claim 7, wherein said re-association information storing means outputs re-association information corresponding to each code word to said multiplexing means in order in which the distinnct symbols occurs.

16. The variable-length encoder using symbol/code-word re-association of a code table as claimed in claim 7, wherein said variable length encoding means is a Huffman encoder.

17. The variable-length encoder using symbol/code-word re-association of a code table as claimed in claim 4, wherein said means for multiplexing and outputting outputs said re-association information whenever a corresponding code word is transmitted.

18. A variable-length decoder for decoding output from a variable-length encoder using symbol/code-word re-association of a code table, the encoder having a previously generated code table stored in a code table, and which outputs data including code words and symbol/code-word re-association information, the decoder comprising:

storing means for storing the same code table as that previously generated and stored in the variable-length encoder;

demultiplexing means for receiving data output from the variable-length encoder, and dividing and outputting symbol/code-word re-association information and code words from the received data, wherein the symbol/code word re-association information for one of the code words is received only when the code word is received for the first time during a predetermined time interval and before another code word is received;

re-associating means for receiving said re-association information from said demultiplexing means, re-associating a code-word and a corresponding symbol, and storing said re-associated code table information; and variable-length decoding means for decoding the code words based on said code table information stored in said re-associating means to thereby generate a symbol.

19. The variable-length decoder as claimed in claim 18, wherein said re-associating means re-associates a code word and a symbol only when said code word has been received and before said another code word is received.

20. The variable-length decoder for decoding the output from a variable-length encoder using symbol/code-word re-association of a code table as claimed in claim 18, wherein said variable-length decoding means is a Huffman decoder.

21. The variable-length decoder for decoding the output from a variable-length encoder using symbol/code-word re-association of a code table as claimed in claim 18, wherein said pre-determined time interval is a time period for one slice of video data.

22. The variable-length decoder for decoding the output from a variable-length encoder using symbol/code-word re-association of a code table as claimed in claim 18, wherein said pre-determined time interval is a time period for one frame of video data.

23. A variable-length decoder for decoding output from a variable-length encoder using symbol/code-word re-association of a code table, the encoder having a previously generated code table stored in a code table, and which outputs data including code words and symbol/code-word re-association information, the decoder comprising:

storing means for storing the same code table as that previously generated and stored in the variable-length encoder;

demultiplexing means for receiving data output from the variable-length encoder, and dividing and outputting symbol/code-word re-association information and code words from the received data, wherein said code words and said symbol/code-word re-association information are received in an alternating manner, and symbol/code-word re-association information for any one of the code words is received before said code words are received;

re-associating means for receiving said re-association information from said demultiplexing means, re-associating a code word and a corresponding symbol when said code word is first received, and storing said re-associated code table information; and variable-length decoding means for decoding the code word based on the code table information stored in said re-associating means to thereby generate a symbol.

24. The variable-length decoder for decoding output from a variable-length encoder using symbol/code-word re-association of a code table as claimed in claim 23, wherein said variable-length decoding means is a Huffman decoder.

25. The variable-length decoder for decoding output from a variable-length encoder using symbol/code-word re-association of a code table as claimed in claim 23, wherein said demultiplexing means receives symbol/code-word re-association information whenever a corresponding code word is received.

26. A variable-length encoding method, comprising:

receiving input data;

delaying the received input data for a pre-determined time period;

counting occurrences of each distinct input data using the delayed input data;

re-associating a relationship between code words and each distinct received input data based on the counted occurrence of each distinct input data, and generating re-association information for each distinct received input data, wherein the code words are read from a previously generated code book;

encoding said received input data using the re-associated relationship and outputting selected code words; and transmitting said re-association information and the selected code words in an alternating manner.

27. A variable-length encoding method as claimed in claim 26, wherein said re-associating is carried out at a pre-determined time interval.

28. A variable-length encoding method as claimed in claim 27, wherein said pre-determined time interval is a time period for one slice of video data.

29. A variable-length encoding method as claimed in claim 27, wherein said pre-determined time interval is a time period for one frame of video data.

30. A variable-length decoding method, comprising:

receiving interleaved re-association information and code word data and separating said re-association information and said code word data;

generating a re-associated code book by modifying association of code words and symbol data as defined in a previously generated code book using said re-association information; and decoding said received code word data using said re-associated code book and outputting decoded data.

31. A variable-length decoding method as claimed in claim 30, wherein said re-association information is received only for distinct received code word data.

32. A variable-length decoding method as claimed in claim 30, wherein said re-association information is received for each received code word data.

33. A variable-length decoding method as claimed in claim 30, wherein said generating a re-associated code book is carried out at a pre-determined time interval.

34. A variable-length decoding method as claimed in claim 33, wherein said pre-determined time interval is a time period for one slice of video data.

35. A variable-length decoding method as claimed in claim 33, wherein said pre-determined time interval is a time period for one frame of video data.

36. A digital data transmission method, comprising:

receiving input data;

delaying the received input data for a pre-determined time period;

counting occurrences of each distinct input data using the delayed input data;

re-associating a relationship between code words and each distinct received input data based on the counted occurrence of each distinct input data, and generating re-association information for each distinct received input data, wherein the code words are read from a previously generated code book;

encoding said received input data using the re-associated relationship and outputting selected code words;

transmitting said re-association information and the selected code words in an alternating manner;

receiving the re-association information and code word data and separating said re-association information and said code word data;

generating a re-associated code book by modifying associations of code words and symbol data as defined in a previously generated code book using said re-association information; and decoding said received code word data using said re-associated code book and outputting decoded data.

*37. A variable-length encoding method, comprising:*

*receiving input symbol data;*

*adapting a relationship between each distinct received input symbol data and variable-length code words and generating adapted association information for each distinct received input symbol data;*

*generating a current code book, having a different association of code words and symbol data as compared to a previously generated code book, in accordance with said adapted association information;*

*variable length coding said input symbol data into variable length code words using said current code book to generate variable length code words; and*

*transmitting said adapted association information and said variable length code words in an alternating manner.*

*38. The variable-length encoding method as claimed in claim 37, wherein the code words of said current code book and said previously generated code book are identical.*

*39. The variable-length encoding method as claimed in claim 38, wherein said generating a current code book is carried out at a predetermined interval.*

*40. The variable-length encoding method as claimed in claim 39, wherein said predetermined interval is for one slice of video data.*

*41. The variable-length encoding method as claimed in claim 39, wherein said predetermined interval is for one frame of video data.*

*42. The variable-length encoding method as claimed in claim 39, wherein said predetermined interval is for one field of video data.*

*43. A variable-length decoding method, comprising:*

*receiving interleaved adapted association information and code word data;*

*generating a current code book, having a different association of code words and symbol data as compared to a previously generated code book, in accordance with said adapted information; and*

*decoding said received code word data using said current code book and outputting decoded data.*

*44. The variable-length decoding method as claimed in claim 43, wherein the code words of said current code book and said previously generated code book are identical.*

*45. The variable-length decoding method as claimed in claim 44, wherein said generating a current code book is carried out at a predetermined interval.*

*46. The variable-length decoding method as claimed in claim 45, wherein said predetermined intervals is for one slice of video data.*

*47. The variable-length decoding method as claimed in claim 45, wherein said predetermined interval is for one frame of video data.*

*48. The variable-length decoding method as claimed in claim 45, wherein said predetermined interval is for one field of video data.*

*49. A variable-length decoding method, comprising:*

*receiving interleaved adapted association information and code word data;*

*generating a current code book, having a different association of code words and symbol data as compared to a previously generated code book, in accordance with said adapted association information; and*

*decoding said received code word data using said current code book and outputting decoded data.*

*50. The variable-length decoding method as claimed in claim 49, wherein the code words of said current code book and said previously generated code book are identical.*

*51. The variable-length decoding method as claimed in claim 50, wherein said generating a current code book is carried out at a pre-determined interval.*

*52. The variable-length decoding method as claimed in claim 51, wherein said predetermined interval is for one slice of video data.*

*53. The variable-length decoding method as claimed in claim 51, wherein said predetermined interval is for one frame of video data.*

*54. The variable-length decoding method as claimed in claim 51, wherein said predetermined interval is for one field of video data.*

*55. A variable-length encoding method, comprising:*

*receiving input symbol data;*

*adapting a relationship between each distinct received input symbol data and variable-length code words and generating adapted association information for each distinct received input symbol data, wherein the adapted association information for a code word is received only when the code word data is received for the first time during a predetermined time interval and before another code word data is received;*

*encoding said received input symbol data using a current code book, having a different association of code words and symbol data as compared to a previously used code book, in accordance with said adapted association information, to generate variable length code words; and*

*transmitting said adapted association information and said variable length code words in an alternating manner.*

*56. The variable-length encoding method as claimed in claim 55, wherein the code words of said current code book and said previously used code book are identical.*

*57. The variable-length encoding method as claimed in claim 56, wherein said encoding said received input symbol data using said current code book is carried out at a pre-determined interval.*

*58. The variable-length encoding method as claimed in claim 57, wherein said predetermined interval is for one slice of video data.*

*59. The variable-length encoding method as claimed in claim 57, wherein said predetermined interval is for one frame of video data.*

*60. The variable-length encoding method as claimed in claim 57, wherein said predetermined interval is for one field of video data.*

*61. A variable-length decoding method, comprising:*

*receiving interleaved adapted association information and code word data;*

*decoding said received code word using a code book, having a different association of code words and symbol data as compared to a previously used code book, in accordance with said adapted association indication information; and*

*outputting said decoded code word data.*

*62. The variable-length decoding method as claimed in claim 61, wherein the code words of said current code book and said previously used code book are identical.*

*63. The variable-length decoding method as claimed in claim 62, wherein said decoding said received code words comprises generating a current code book based on said adapted indication information during a pre-determined interval.*

*64. The variable-length decoding method as claimed in claim 63, wherein said predetermined interval is for one slice of video data.*

*65. The variable-length decoding method as claimed in claim 63, wherein said predetermined interval is for one frame of video data.*

*66. The variable-length decoding method as claimed in claim 63, wherein said predetermined interval is for one field of video data.*

* * * * *